US008373844B2

(12) United States Patent
Nomoto

(10) Patent No.: US 8,373,844 B2

(45) **Date of Patent: *Feb. 12, 2013**

(54) EXPOSURE APPARATUS HAVING AN ELEMENT TO BE COOLED

(75) Inventor: Makoto Nomoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 255 days.

This patent is subject to a terminal disclaimer.

(21) Appl. No.: 12/628,252

(22) Filed: Dec. 1, 2009

(65) Prior Publication Data

US 2010/0073649 A1 Mar. 25, 2010

Related U.S. Application Data

(62) Division of application No. 11/552,007, filed on Oct. 23, 2006, now Pat. No. 7,679,716.

(30) Foreign Application Priority Data

Oct. 24, 2005 (JP) ................................ 2005-308968

(51) Int. Cl.
*G03B 27/52* (2006.01)
*G03B 27/42* (2006.01)

(52) U.S. Cl. ........................................... 355/30; 355/53

(58) Field of Classification Search .................... 355/30, 355/53, 67; 250/548
See application file for complete search history.

(56) References Cited

U.S. PATENT DOCUMENTS

| | | | | |
|---|---|---|---|---|
| 6,987,554 B2 | 1/2006 | Nomoto | .......................... | 355/53 |
| 7,317,505 B2 * | 1/2008 | Aichi et al. | ..................... | 355/30 |
| 7,362,415 B2 | 4/2008 | Franken et al. | ................. | 355/67 |
| 7,679,716 B2 * | 3/2010 | Nomoto | .......................... | 355/30 |
| 2005/0110968 A1 | 5/2005 | Aichi et al. | ..................... | 355/30 |
| 2006/0176455 A1 | 8/2006 | Nomoto | .......................... | 355/53 |
| 2007/0089853 A1 | 4/2007 | Nomoto | .......................... | 165/65 |

FOREIGN PATENT DOCUMENTS

JP 2002-206833 7/2002

* cited by examiner

*Primary Examiner* — Hung Henry Nguyen

(74) *Attorney, Agent, or Firm* — Fitzpatrick, Cella, Harper & Scinto

(57) ABSTRACT

An exposure apparatus having an element to be cooled and that exposes a substrate to patterned radiation by using the element. A reservoir houses a liquid coolant therein. A first pump, disposed between the reservoir and the element, supplies the coolant from the reservoir to the element. A heater, disposed between the first pump and the element, heats the coolant supplied from the first pump. A jacket receives the coolant from the heater and cools the element. A second pump, disposed between the jacket and the reservoir, reduces a pressure of the jacket and supplies the coolant from the jacket to reservoir. A cooler, disposed between the second pump and the reservoir, cools the coolant supplied from the second pump.

3 Claims, 6 Drawing Sheets

EXPOSURE APPARATUS HAVING AN ELEMENT TO BE COOLED

This application is a divisional application of U.S. patent application Ser. No. 11/552,007, filed on Oct. 23, 2006, which was published as U.S. Patent Application Publication No. 2007/0089853 A1 on Apr. 26, 2007, and which issued as U.S. Pat. No. 7,679,716 on Mar. 16, 2010.

This application also claims priority from Japanese Patent Application No. 2005-308968, filed Oct. 24, 2005, which is hereby incorporated by reference herein.

FIELD OF THE INVENTION AND RELATED ART

This invention relates to an exposure apparatus and a device manufacturing method usable in the manufacture of semiconductor devices, for example.

FIG. 4 illustrates a general structure of an exposure apparatus to which the present invention is applicable.

Denoted in the drawing at 31 is a light source of the exposure apparatus used for the manufacture of semiconductor devices, for example. With regard to the wavelength of the light source, it has been shortened more and more, to meet further miniaturization in linewidth of exposure patterns, i.e., from i-line to an excimer laser and, in the latter, from a KrF excimer laser to an ArF excimer laser. Currently, in order to meet yet further miniaturization in linewidth, the use of an $F_2$ laser or EUV (Extreme Ultraviolet) light has been attempted.

A light beam 31*a* emitted from the light source 31 is directed through a light input 32 to an illumination optical system 33, by which any illuminance non-uniformity is removed, and beam shaping is performed, whereby an illumination light beam 31*b* is produced. The light beam 31*b* is then projected onto a reticle 34, which is an original of the exposure pattern. The reticle 34 is placed on a reticle stage 35.

The light beam passes through the reticle 34 as a light beam 31*c*, which is subsequently projected through a projection optical system 36 onto a wafer 37, in a reduced scale. The wafer 37 is disposed at a plane which is optically conjugate with the reticle 34.

The wafer 37 is placed on a wafer stage 38, which is driven by linear motors, such that repeated exposures based on the step-and-repeat method are carried out.

In recent years, in an attempt to meet further miniaturization in linewidth of integrated circuits, there have been developed semiconductor exposure apparatuses of the type that the reticle stage 35, as well, is driven by linear motors, such that both the wafer stage 38 and the reticle stage 35 are moved in synchronism with each other. In these types of exposure apparatuses, the exposure area is narrowed into a slit-like shape, and the wafer is exposed while both the reticle and the wafer are being scanningly moved.

Here, generally, the linear motor, which is used as a drive source for the reticle stage 35, has a large amount of heat generation. In consideration of this, usually, it is cooled by cooling means having a jacket, through which a liquid cooling medium (coolant) is circulated.

There is another problem. The projection optical system 36 and the reticle 34, through which the exposure light passes, absorb a portion of the energy of exposure light 31 or 31*c*, and accumulation of heat resulting from this energy absorption has a non-negligible adverse influence on the imaging performance. Therefore, a fluid-circulation type cooling structure is used in association with the projection optical system 36 and the reticle 34.

FIG. 5 illustrates a conventional fluid cooling-medium circulation system in which a heat accumulating (reserving) member or a heat exhausting member is cooled by means of a liquid cooling medium (coolant), and the cooling medium is circulated to cool the components housed inside an exposure apparatus.

As shown in FIG. 5, for heat exhaustion and temperature adjustment, a jacket 13, formed in the heat exhausting member 11, is connected to a circulating device 12 through an upstream pipe 14*a* and a downstream pipe 14*b*, respectively, whereby a liquid cooling-medium circulation system for the cooling medium 15 is provided. Here, the circulating device 12 comprises a cooling device 19 for exhausting the heat from the cooling medium 15, which has absorbed heat discharged from the heat exhausting member 11, a reservoir 16 for reserving the cooling medium 15 supplied from the cooling device 19, a supply pump 17 for drawing the cooling medium 15 from the reservoir and supplying it, a heating device 18 for heating the cooling medium 15 supplied from the supply pump 17, a temperature sensor 20 for detecting the temperature 20*a* at the downstream pipe 14*b* connected to the jacket 13, and a temperature controller 21 for controlling the heating temperature at the heating device 18, so as to maintain the temperature 20*a* at a predetermined level.

The cooling medium 15 inside the reservoir 16 is forwarded by the supply pump 17 to the heating device 18 and, after being heated and temperature-controlled, it is supplied into the heat exhausting member 11.

In order to maintain the temperature 20*a* of the cooling medium 15 to be detected by the temperature sensor 20, at a constant level, PID feedback control through the temperature controller 21 is carried out. Thus, by controlling the output of the heating device 18, the heating and temperature-adjustment are performed.

The thus temperature-controlled cooling medium 15 goes through the heat exhausting member 11 and the jacket 13 formed in the heat exhausting member 11, whereby heat exchanging is carried out. By this, the temperature of the heat exhausting member 11 is stabilized about the temperature of the cooling medium 15, and the heat exhausting of the heat exhausting member 11 is accomplished.

The cooling medium 15, having absorbed the heat from the heat exhausting member 11, is forwarded to the cooling device 19, whereby the heat is discharged outwardly of the circulating device 12 (circulation system). After that, the cooling medium 15 returns to the reservoir 16.

In the liquid cooling-medium circulation system of this example, the heat exhausting and temperature adjustment of the heat exhausting member 11 is carried out with the structure as described above.

Furthermore, Japanese Laid-Open Patent Application, Publication No. 2002-206833, proposes a method of reducing vibration of a structure housed in a container, in a cooling system for cooling that structure by use of a liquid cooling medium introduced into the container.

On the other hand, in order to meet the required increases in the throughput of recent exposure apparatuses, the amount of heat generation by the linear motor is increasing. The heat generation of the linear motor will cause a temperature fluctuation inside the exposure apparatus, resulting in degradation of the measurement precision of laser interferometers or, alternatively, measurement errors, due to thermal expansion.

In order to reduce the thermal influence, the flow rate of the cooling medium should be increased. However, the increase of the cooling-medium flow rate will lead to increased pressure applied to the jacket 13. Since the pressure increase is proportional to the square of the flow rate increase, the increase of the flow rate is limited by the withstanding pressure of the jacket 13.

If the withstanding pressure of the jacket 13 cannot be enlarged, due to structural reasons, the system has to be operated with a restricted flow rate of the cooling medium, and yet, without causing thermal influence. Hence, the speed performance of the stage itself could not be used, and the throughput would necessarily be decreased.

As a convenient solution for reducing the pressure, a liquid forwarding supply pump 17 may be disposed downstream of the heat exhausting member 11, which is a heat source.

In this case, the disposition of the circulation system components is in an order of reservoir 16, heat exchanging member 11 and supply pump 17. Thus, the reservoir 16 is at an atmospheric pressure and the suction port of the supply pump 17 is at a negative pressure, corresponding to the pressure loss.

However, there is a limitation due to the vapor pressure of the cooling medium 15 and the required NPSH (Net Positive Suction Head) of the pump 16. Therefore, if the system has a large loss, it is impossible to provide a large flow rate.

SUMMARY OF THE INVENTION

It is, accordingly, an object of the present invention to provide a unique technique, by which the pressure increase in a jacket can be reduced, and yet, the flow rate of a cooling medium can be enlarged.

In accordance with one aspect, the present invention, to achieve this object, provides an exposure apparatus having an element to be cooled and being configured to expose a substrate to pattern radiation by using the element, the apparatus comprising a reservoir configured to house a liquid coolant therein, a first pump disposed between the reservoir and the element and configured to supply the coolant from the reservoir to the element, a heater disposed between the first pump and the element and configured to heat the coolant supplied from the first pump, a jacket configured to receive the coolant from the heater and to cool the element, a second pump disposed between the jacket and the reservoir and configured to supply the coolant from the jacket to the reservoir, and a cooler disposed between the second pump and the reservoir, and configured to cool the coolant supplied from the second pump.

In accordance with another aspect, the present invention provides a method of manufacturing a device, the method comprising steps of exposing a substrate to light using an exposure apparatus as recited above, developing the exposed substrate, and processing the developed substrate to manufacture the device.

These and other objects, features and advantages of the present invention will become more apparent upon a consideration of the following description of the preferred embodiments of the present invention, taken in conjunction with the accompanying drawings.

DESCRIPTION OF THE PREFERRED EMBODIMENTS

Preferred embodiments of the present invention will now be described with reference to the attached drawings.

[Embodiment 1]

Figure 1:
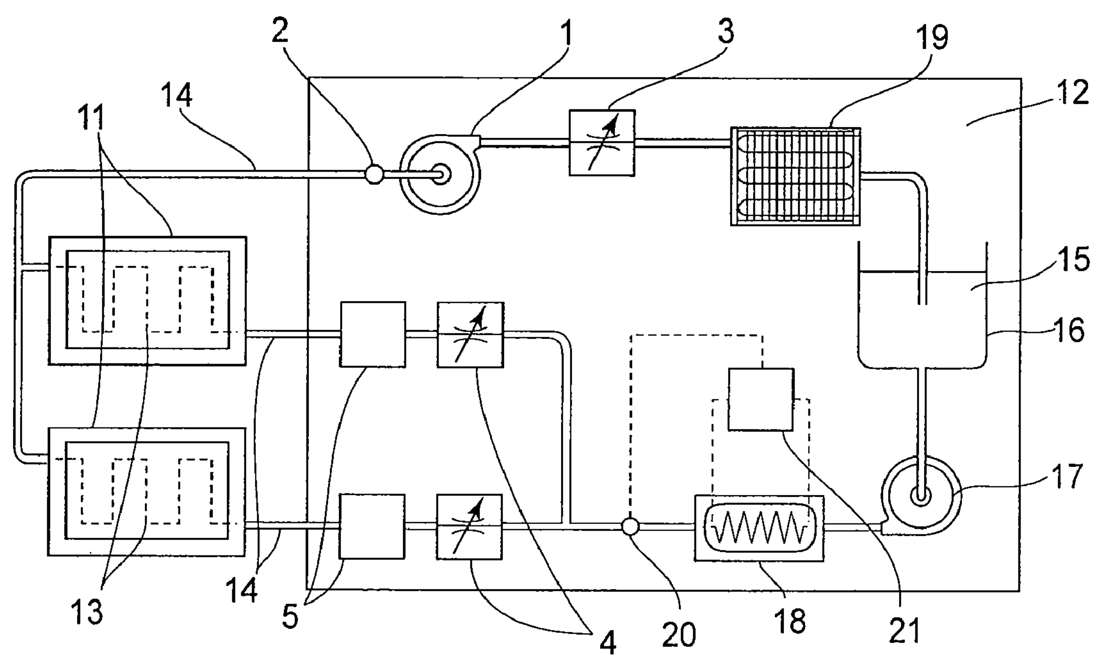
FIG. 1 is a schematic view showing a general structure according to a first embodiment of the present invention.

Referring to FIG. 1, a liquid cooling medium circulation system for an exposure apparatus, according to a first embodiment of the present invention, will be described.

Figure 5:
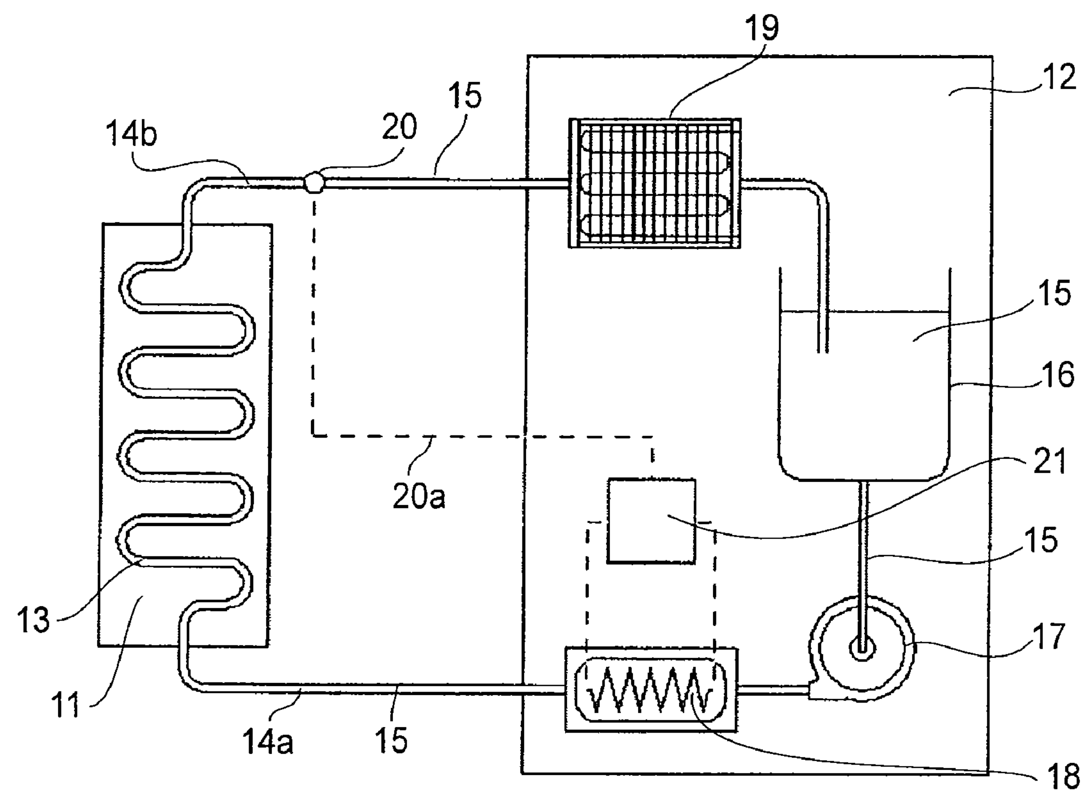
FIG. 5 is a schematic view showing a general structure of a conventional liquid cooling-medium circulation system.

The reference numerals in FIG. 1 similar to those referred to in the conventional structure shown in FIG. 5 are assigned to corresponding elements. In this embodiment, a plurality of heat exhausting members 11 are used.

Figure 4:
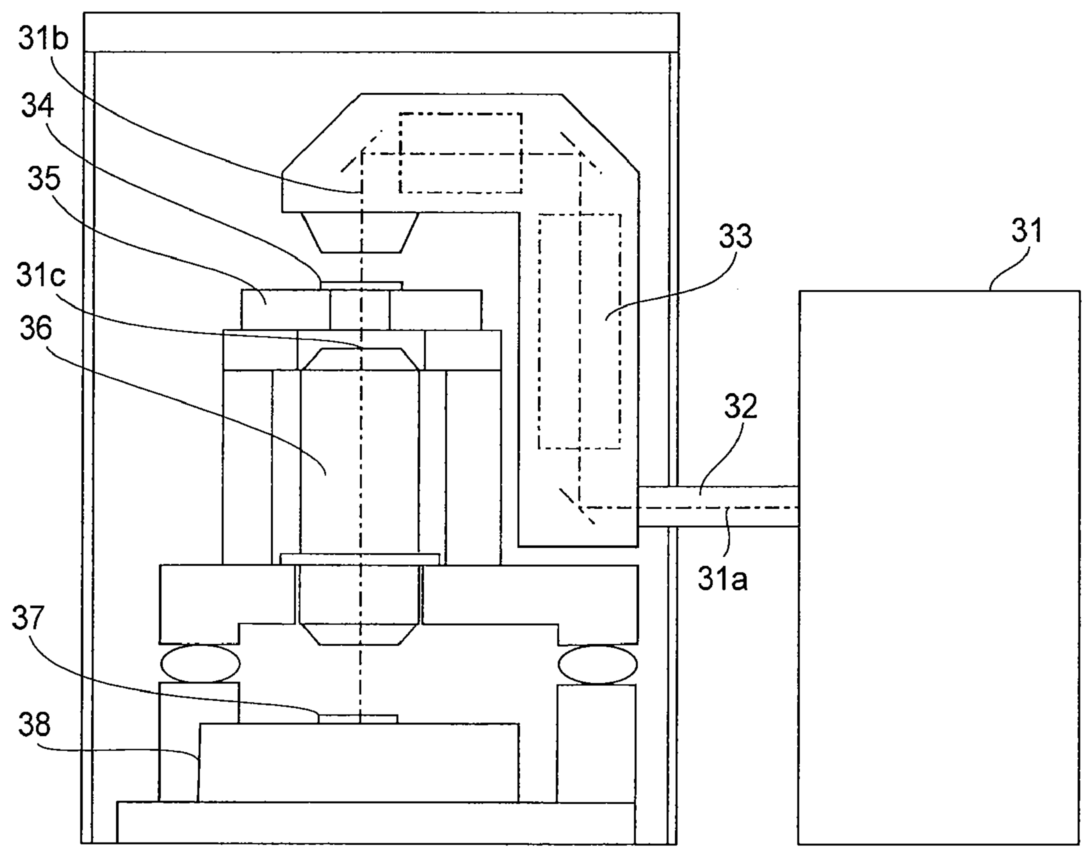
FIG. 4 is a schematic view of an exposure apparatus to which an embodiment of the present invention is applied.

Generally, the liquid cooling medium circulation system of the exposure apparatus, according to the first embodiment, is arranged to cool, by means of a liquid-like cooling medium (coolant), the heat exhausting member, which exhausts heat to cool the components housed inside an exposure apparatus, such as shown in FIG. 4.

A reservoir 16 is a container, which is filled with a cooling medium (coolant) 15. A supply pump 17 is a device, which is provided at the upstream side of the heat exhausting members 11, for supplying the cooling medium 15 from the reservoir 16.

A heating device 18 is a heater for heating the cooling medium 15 supplied thereto from the supply pump 17. A temperature controller 21 is a device for controlling the heating temperature at the heater 18, so as to maintain the temperature of the cooling medium 15 at a predetermined temperature.

Jackets 13 are formed in the heat exhausting members 11, and the cooling medium 15 is supplied thereto from the heater 18. A pressure reducing pump 1 is provided at the downstream side of the heat exhausting members 11. The pump 1 is communicated with each jacket 13 to reduce the pressure inside the jacket 13.

A cooling device 19 is a device for exhausting heat out of the cooling medium 15 as supplied from the pressure reducing pump 1. The circulation system 12 includes the components described above.

The cooling medium 15 is temperature adjusted in a similar manner as has been described with reference to the conventional coolant circulation system shown in FIG. 5.

The pressure at the suction port of the pressure reducing pump 1 corresponds to the remainder that remains when the head $\Delta Ph$ of the pressure reducing pump 1 is subtracted from the pressure loss $\Delta Pr$ from the pressure reducing pump 1 to the reservoir 16. Thus, a negative pressure is reduced if the head generated by the pressure reducing pump 1 is larger than the pressure loss downstream of it. Furthermore, if the pressure reducing pump 1 is disposed at a position higher than the reservoir 16, and when the height (level) difference therebetween is denoted by h, the liquid cooling medium density is denoted by $\rho$ and the gravitational acceleration is denoted by g, the pressure is reduced by an amount corresponding to "$\rho gh$".

However, in liquid medium pumping, there is a negative pressure limit (vacuum limit) depending on the vapor pressure of the liquid cooling medium at a temperature thereof being used, as well as the required NPSH of the pump itself. If the level is lower than the negative pressure limit value, cavitation occurs and pumping of the cooling medium is no longer attainable. Additionally, the components of the circulation system may be seriously damaged.

In consideration of this, and in order to avoid cavitation, a pressure sensor 2 is provided to detect the pressure at the suction port of the pressure reducing pump 1, where the pressure becomes lowest.

In addition to this, a pressure-reducing-pump suction pressure adjusting means, which comprises a back pressure adjusting valve 3, disposed downstream of the pressure reducing pump 1, is newly provided. More specifically, the pressure loss at the downstream side of the pressure reducing pump 1 is adjusted by means of the back pressure adjusting valve 3, to limit the suction pressure from going beyond the negative pressure limit.

Alternatively, a pressure control system (not shown) that controls the back pressure adjusting valve 3, while using the pressure sensor 2 as an input, and the back pressure adjusting valve 3 as an output, may be provided, to assure that the suction pressure of the pressure reducing pump 1 is maintained at a predetermined constant pressure.

The flow rate adjustment is carried out by using flow rate adjusting means that comprises a flow rate adjusting valve 4 and a flow rate sensor 5, which are disposed between the heat exhausting member 11 and the supply pump 17. By disposing the flow rate adjusting valve 4 at the upstream side of the heat exhausting member 11, a pressure rise corresponding to the pressure loss is prevented.

When a plurality of heat exhausting members are used, such as in the first embodiment, preferably, each member should be provided with similar flow rate adjusting means.

Alternatively, a flow rate control system (not shown), which controls the flow rate adjusting valve 4 while using the flow rate sensor 5 as an input and the flow rate adjusting valve 4 as an output, may be provided, to assure that the flow rate is maintained at a predetermined constant level.

In accordance with the first embodiment described above, the pressure to be applied to the heat exhausting member 11 can be reduced by an amount corresponding to the sum of the pressure loss downstream of the pressure reducing pump 1 and the negative pressure limit.

Furthermore, with the provision of the suction pressure adjusting means for the pressure reducing pump 1, any differences in height or in pipe pressure loss can be absorbed flexibly.

For enhanced pressure reduction effect, the reducing pump 1 should, preferably, be disposed downstream of, and yet, quite close to, the exhausting member, as much as possible.

[Embodiment 2]

Next, referring to FIG. 2, a liquid cooling medium circulation system for an exposure apparatus, according to a second embodiment of the present invention, will be described.

Similar reference numerals are assigned to the components of this embodiment corresponding to those of the first embodiment shown in FIG. 1.

In this embodiment, the suction pressure adjusting means for the pressure reducing pump 1 comprises a pressure-reducing-pump revolution control system 6 that controls the revolution speed of the pressure reducing pump 1, while using the pressure sensor 2 as an input and the pressure reducing pump 1 as an output, to assure that the suction pressure of the pressure reducing pump 1 is maintained at a predetermined constant pressure.

Furthermore, the flow rate adjusting means comprises a supply pump revolution control system 7 that controls the revolution speed of the supply pump 17, while using the flow rate sensor 5 as an input and the supply pump 17 as an output, to assure that a predetermined constant flow rate is maintained.

A similar pressure reducing effect is attainable with this embodiment, as in the first embodiment.

[Embodiment 3]

Figure 3:
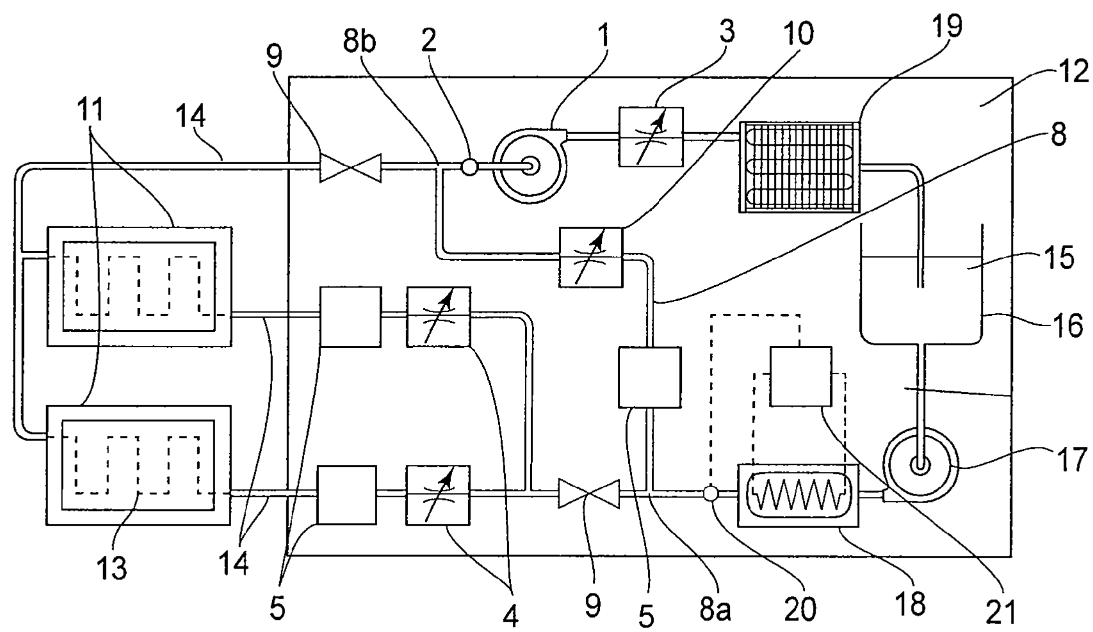
FIG. 3 is a schematic view showing a general structure according to a third embodiment of the present invention.

Next, referring to FIG. 3, a liquid cooling medium circulation system for an exposure apparatus, according to a third embodiment of the present invention, will be described.

Figure 2:
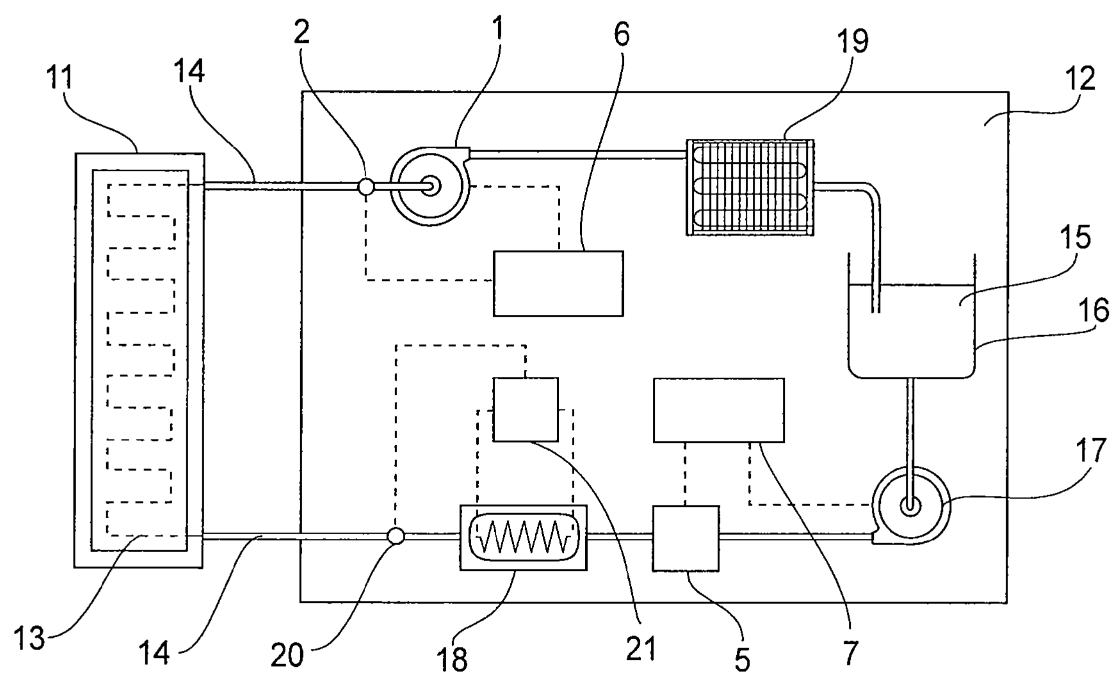
FIG. 2 is a schematic view showing a general structure according to a second embodiment of the present invention.

Similar reference numerals are assigned to the components of this embodiment corresponding to those of the first and second embodiments shown in FIGS. 1 and 2.

In this embodiment, a bypass pipe 8 extends without passing through the flow rate adjusting valves 4 and the heat exhausting members 11.

In addition to this, a shut-off valve 9 is provided at the downstream side of a branching point **8*a* of the bypass pipe 8 and at the upstream side of the heat exhausting member 11. Furthermore, another shut-off valve 9 is provided at the upstream side of the heat exhausting member 11. Also, a bypass flow rate adjusting valve 10 is provided along the bypass pipe 8**.

When the flow rate adjustment is made manually by using the flow rate adjusting valve 4, and if the supply pump 17 is started before the adjustment is made, it is possible that the liquid medium flows at a flow rate more than a predetermined flow rate, and the pressure goes beyond the withstanding pressure. If the flow rate adjusting valve is restricted to prevent this, it leads to a non-discharge operation of the supply pump 17, which is disadvantageous.

In consideration of this, the bypass pipe 8 and the shut-off valve 9 are provided as a protecting means for the heat exhausting member 11. In operation, while keeping the shut-off valve 9 closed, the supply pump 17 is started with the bypass pipe 8, and a pseudo pressure loss of the heat exhausting member 11 is generated through the bypass flow rate adjusting valve 10 on the bypass pipe 8.

Furthermore, after the flow rate adjustment, the shut-off valve 9 is opened and the flow rate adjusting valve 4 is opened, while the bypass flow rate adjusting valve is restricted. By this, any problems due to the pressure rise in the initial flow rate adjustment are avoided.

[Embodiment of Device Manufacturing Method]

Next, an embodiment of a device manufacturing method, which uses an exposure apparatus described above, will be explained with reference to an example of semiconductor device manufacture.

Figure 6:
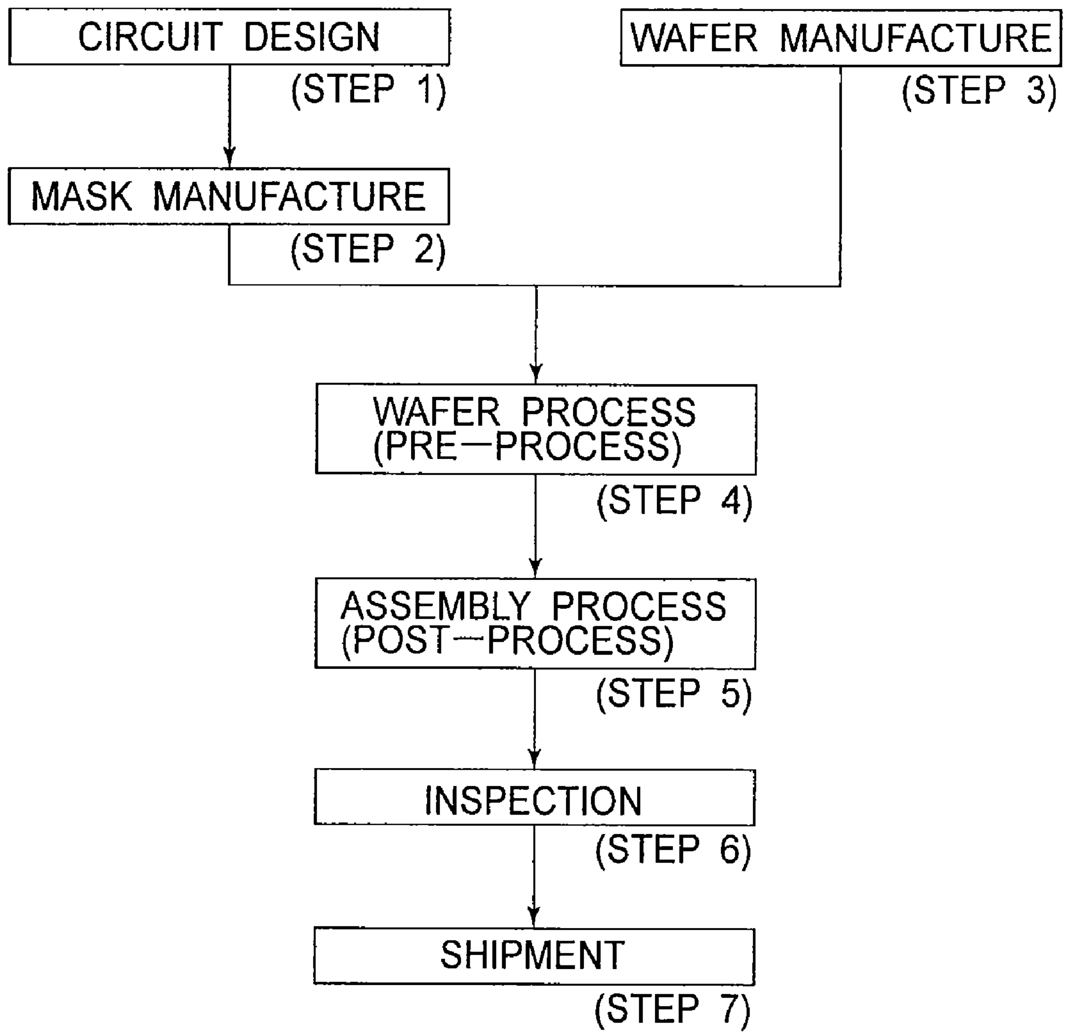
FIG. 6 is a flow chart for explaining microdevice manufacturing processes.

FIG. 6 is a flow chart for explaining the overall procedure for semiconductor device manufacture. Step 1 is a design process for designing a circuit of a semiconductor device. Step 2 is a process for making a mask on the basis of the circuit pattern design.

On the other hand, Step 3 is a process for preparing a wafer by using a material such as silicon. Step 4 is a wafer process, which is called a pre-process, wherein, by using the thus prepared mask and wafer, a circuit is formed on the wafer, in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step, wherein an operation check, a durability check, and so on, for the semiconductor devices produced by step 5, are carried out. With these processes, semiconductor devices are produced, and finally, they are shipped (step 7).

More specifically, the wafer process at step 4, described above, includes (i) an oxidation process for oxidizing the surface of a wafer, (ii) a CVD process for forming an insulating film on the wafer surface, (iii) an electrode forming process for forming electrodes upon the wafer by vapor deposition, (iv) an ion implanting process for implanting ions to the wafer, (v) a resist process for applying a resist (photosensitive material) to the wafer, (vi) an exposure process for exposing the resist-coated wafer to light or patterned radiation, through the circuit pattern of the mask, by using the exposure apparatus described above, (vii) a developing process for developing the exposed wafer, (viii) an etching process for removing portions other than the developed resist image, and (ix) a resist separation process for separating the resist material remaining on the wafer after being subjected to the etching process. By repeating these processes, circuit patterns are superposedly formed on the wafer.

As described above, the liquid cooling medium circulation system, according to the embodiments of the present invention explained above, may comprise a supply pump disposed upstream of a heat exhausting member, for supplying a cooling medium thereto from a reservoir, and a pressure reducing pump provided downstream of the heat exhausting member and being communicated with a jacket, to reduce the pressure in the jacket. With this arrangement, even for a heat exhausting member having a low withstanding pressure, the flow rate of the cooling medium can be enlarged, without causing a pressure increase and, as a result of thermal influence can be reduced. Hence, components housed inside the exposure apparatus, such as stages, for example, can be cooled, while assuring a high throughput.

While the invention has been described with reference to the structures disclosed herein, it is not confined to the details set forth, and this application is intended to cover such modifications or changes as may come within the purposes of the improvements or the scope of the following claims.

What is claimed is:

1. An exposure apparatus having an element to be cooled and being configured to expose a substrate to patterned radiation by using the element, said apparatus comprising:

a reservoir configured to house a liquid coolant therein;

a jacket configured to cool the element;

a first pump disposed downstream of said reservoir and upstream of said jacket with respect to a flow direction of the liquid coolant, and being configured to supply the coolant from said reservoir to said jacket;

a heater disposed between said first pump and said jacket, and being configured to heat the coolant supplied from said first pump;

a second pump disposed downstream of said jacket and upstream of said reservoir with respect to the flow direction, and being configured to reduce a pressure of said jacket, and to supply the coolant from said jacket to said reservoir; and a cooler disposed between said second pump and said reservoir, and being configured to cool the coolant supplied from said second pump.

2. An apparatus according to claim 1, further comprising (i) a bypass flow passage configured to bypass the element, said bypass flow passage being configured to connect a branching point between said first pump and the element to a junction between the element and said second pump, (ii) a first shut-off valve provided between the branching point and the element, and (iii) a second shut-off valve provided between the element and the junction.

3. An apparatus according to claim 2, further comprising a third valve disposed at said bypass flow passage and configured to adjust the flow rate of the coolant through said bypass flow passage.

* * * * *